United States Patent
Choi et al.

(10) Patent No.: US 8,310,869 B2
(45) Date of Patent: Nov. 13, 2012

(54) NONVOLATILE MEMORY DEVICE, SYSTEM, AND PROGRAMMING METHOD

(75) Inventors: Sang-Hoon Choi, Seoul (KR); Jun-Ho Jang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 298 days.

(21) Appl. No.: 12/711,450

(22) Filed: Feb. 24, 2010

(65) Prior Publication Data
US 2010/0220526 A1    Sep. 2, 2010

(30) Foreign Application Priority Data
Mar. 2, 2009    (KR) .................. 10-2009-0017706

(51) Int. Cl.
*G11C 11/34* (2006.01)
(52) U.S. Cl. .................................. 365/185.03
(58) Field of Classification Search ............ 365/185.03
See application file for complete search history.

(56) References Cited

U.S. PATENT DOCUMENTS

| | | | |
|---|---|---|---|
| 2008/0098161 A1* | 4/2008 | Ito | 711/103 |
| 2009/0310408 A1* | 12/2009 | Lee et al. | 365/185.03 |
| 2009/0327585 A1* | 12/2009 | Yeh | 711/103 |
| 2010/0064092 A1* | 3/2010 | Hess et al. | 711/103 |
| 2010/0074012 A1* | 3/2010 | Park et al. | 365/185.03 |
| 2010/0246260 A1* | 9/2010 | Kang | 365/185.03 |

FOREIGN PATENT DOCUMENTS

| | | |
|---|---|---|
| JP | 2005115857 A | 4/2005 |
| KR | 1020060090088 A | 8/2006 |
| KR | 1020070091452 A | 9/2007 |
| KR | 1020080027419 A | 3/2008 |

* cited by examiner

*Primary Examiner* — Hoai V Ho
*Assistant Examiner* — Min Huang
(74) *Attorney, Agent, or Firm* — Volentine & Whitt, PLLC (57) ABSTRACT

A nonvolatile memory device stores program data in a first address area, determines whether the first address area is a most significant address area and whether the program data is reliable data, and upon determining that the first address area is not a most significant address area and that the program data is reliable data, additionally stores the program data in a second address area.

17 Claims, 11 Drawing Sheets

NONVOLATILE MEMORY DEVICE, SYSTEM, AND PROGRAMMING METHOD

STATEMENT OF RELATED APPLICATIONS

This application claims priority under 35 U.S.C. §119 to Korean Patent Application No. 10-2009-0017706 filed on Mar. 2, 2009, the disclosure of which is hereby incorporated by reference in its entirety.

BACKGROUND

The inventive concept relates generally to semiconductor memory devices. More particularly, the inventive concept relates to nonvolatile memory devices, methods of programming the same, and memory systems comprising the same.

Semiconductor memory devices can be roughly classified into two types based on their ability to maintain stored information when disconnected from power. These types include nonvolatile semiconductor devices, which are generally capable of maintaining stored information when disconnected from power, and volatile semiconductor memory devices, which generally lose stored information when disconnected from power.

Examples of nonvolatile memory devices include read only memory (ROM), programmable ROM (PROM), erasable PROM (EPROM), electrically-erasable PROM (EEPROM), flash memory (a type of EEPROM), phase-changeable random access memory (PRAM), magnetoresistive random access memory (MRAM), and ferroelectric random access memory (FRAM). Flash memory can be roughly classified into two types based on the configuration of memory cells and related access circuitry. These types are NOR-type flash memories and NAND-type flash memory.

Examples of volatile memory devices include static random access memories (SRAM), dynamic random access memories (DRAM), and synchronous dynamic random access memories (SDRAM).

SUMMARY

Embodiments of the inventive concept provide a method of programming a nonvolatile memory device. In some embodiments, the method comprises storing program data in a first address area, determining whether the first address area is a most significant address area and whether the program data is reliable data, and upon determining that the first address area is not a most significant address area and that the program data is reliable data, additionally storing the program data in a second address area.

In certain embodiments, the method further comprises upon determining that the first address area is a most significant address area, completing the programming without additionally storing the program data in the second address area.

In certain embodiments, the first address area is a central significant address area, the nonvolatile memory device is a flash memory device, and the flash memory device comprises N-bit memory cells. In certain embodiments, the reliable data comprises metadata.

In certain embodiments, additionally storing the program data in a second address area comprises reading data stored in the first address area and storing the read data in the second address area.

In certain embodiments, additionally storing the program data in a second address area comprises incrementing or decrementing an address of the first address to generate an address for the second address area.

In certain embodiments, the first and second address areas correspond to different columns of memory cells within a memory cell array.

Other embodiments of the inventive concept further provide a nonvolatile memory device comprising a memory cell array, a read/write circuit configured to write and read data to and from the memory cell array, and a control logic configured to control the read/write circuit. The control logic controls the read/write circuit to store program data in a first address area, determines whether the first address area is a most significant address area and whether the program data is reliable data, and upon determining that the first address area is not a most significant address area and that the program data is reliable data, controls the read/write circuit to additionally store the program data in a second address area.

Still other embodiments of the inventive concept provide a system comprising a nonvolatile memory device and a controller configured to control the nonvolatile memory device. The controller controls the nonvolatile memory device to write program data into a first address area or into the first address area and a second address area according to a reliability information of the program data and an address of the first address area.

BRIEF DESCRIPTION OF THE DRAWINGS

Embodiments will be more clearly understood from the following detailed description taken in conjunction with the accompanying drawings. In the drawings, like reference numerals denote like features. The drawings are not necessarily to scale, with emphasis instead being placed on illustrating various aspects of the inventive concept.

DETAILED DESCRIPTION OF THE EMBODIMENTS

Various embodiments will be described more fully hereinafter with reference to the accompanying drawings. The present inventive concept may, however, be embodied in many different forms and should not be construed as being limited to only the illustrated embodiments. Rather, these embodiments are presented as teaching examples.

Figure 1:
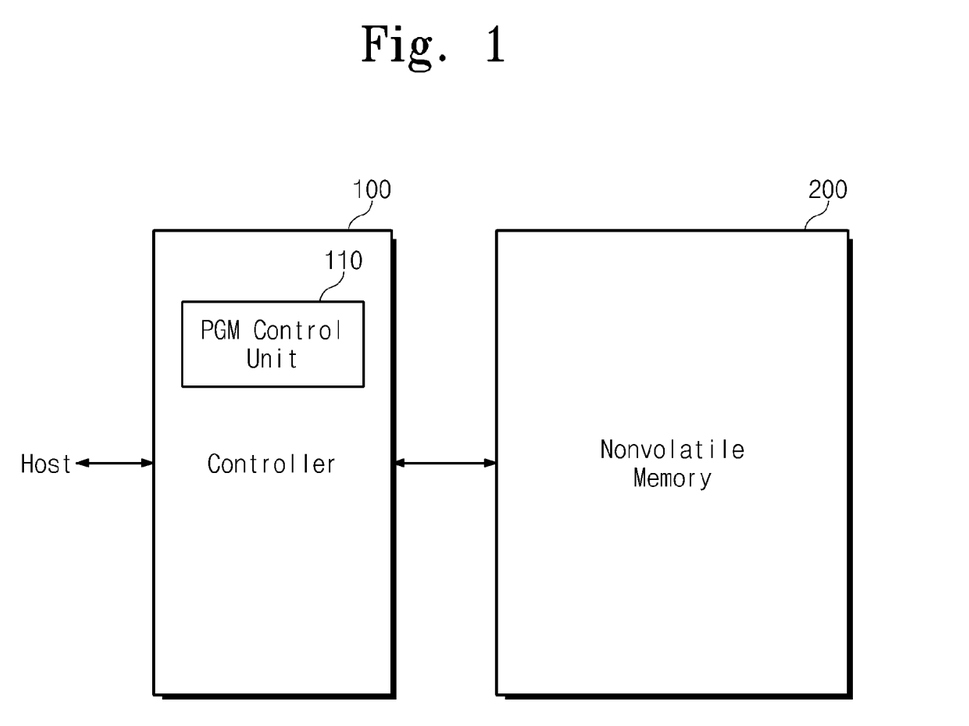
FIG. 1 is a block diagram of a memory system according to some embodiments of the inventive concept.

FIG. 1 is a block diagram of a memory system 10 according to some embodiments of the inventive concept. Memory system 10 comprises a nonvolatile memory device 200 and a controller 100. Controller 100 is connected to a host and to nonvolatile memory device 200. Controller 100 transmits data read from nonvolatile memory device 200 to the host and stores data transmitted from the host in nonvolatile memory device 200.

In the example of FIG. 1, controller 100 comprises a program (PGM) control unit 110 for controlling programming operations of nonvolatile memory device 200, a RAM, a processing unit, a host interface, and a memory interface, and an error correction code (ECC) block for detecting and correcting errors in data read out of nonvolatile memory device 200. In various alternative embodiments, some or all of these elements may be modified or omitted.

The processing unit controls all operations of controller 100. The host interface implements a protocol for data exchange between the host and controller 100. Examples of protocols that could be used by the host interface include USB, MMC, PCI-E, Advance Technology Attachment (ATA), Serial-ATA, Parallel-ATA, SCSI, ESDI, and Integrated Drive Electronics (IDE). The memory interface interfaces with nonvolatile memory device 200.

Nonvolatile memory device 200 comprises a memory cell array for storing data, a read/write circuit for writing and reading data to and from the memory cell array, an address decoder for decoding an address before transmitting the decoded address to the read/write circuit, and a control logic component for controlling all operations of nonvolatile memory device 200. Nonvolatile memory device 200 is described in further detail below with reference to FIG. 2.

In some embodiments, nonvolatile memory device 200 and controller 100 are integrated into a single semiconductor device and then incorporated in a memory card or other standalone memory product. As examples, a single semiconductor device comprising controller 100 and nonvolatile memory device 200 could be integrated in a PC (or PCMCIA) card, a compact flash (CF) card, a smart media (SM) card, a memory stick, a multimedia card (MMC, RS-MMC, MMC-micro), an SD card (SD, miniSD, microSD), or a universal flash memory device (UFS).

In some embodiments, controller 100 and nonvolatile memory device 200 are integrated into a single semiconductor device and incorporated into a solid state disk/drive (SSD). Where memory system 10 is used in an SSD, an operation speed of a host connected to memory system 10 may be dramatically improved.

In still other embodiments, memory system 10 may be incorporated in, e.g., a computer, a portable computer, a UMPC, a workstation, a net-book, a PDA, a wet tablet, a wireless phone, a mobile phone, a smart phone, a digital camera, a digital audio recorder/player, a digital picture/video recorder or player, a home networking device, or a device forming part of a telematics network, to name but a few.

Nonvolatile memory device 200 or memory system 10 may be mounted in any of several different types of packages or package configurations. For instance, they may be mounted within a packages having any of the following configurations: package on package (PoP), a ball grid array (BGA), chip scale package (CSP), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

Program control unit 110 controls program operations of nonvolatile memory device 200. In particular, program control unit 110 controls program operations where "reliable data" is programmed in a first or second address area of nonvolatile memory device 200.

The term "reliable data" here refers to data that is or may be expected to be reliable. Such data may be required, for instance, for normal operation or security of nonvolatile memory device 200. As examples, the reliable data may include code, tables, or metadata used for configuration, booting, memory allocation, or memory access. It may also include data provided by a user, such as security information. It should be noted, however, that the reliable data is not limited in kind The designation as reliable data may simply indicate that the information is relatively more significant compared with other data stored in nonvolatile memory device 200.

Figure 2:
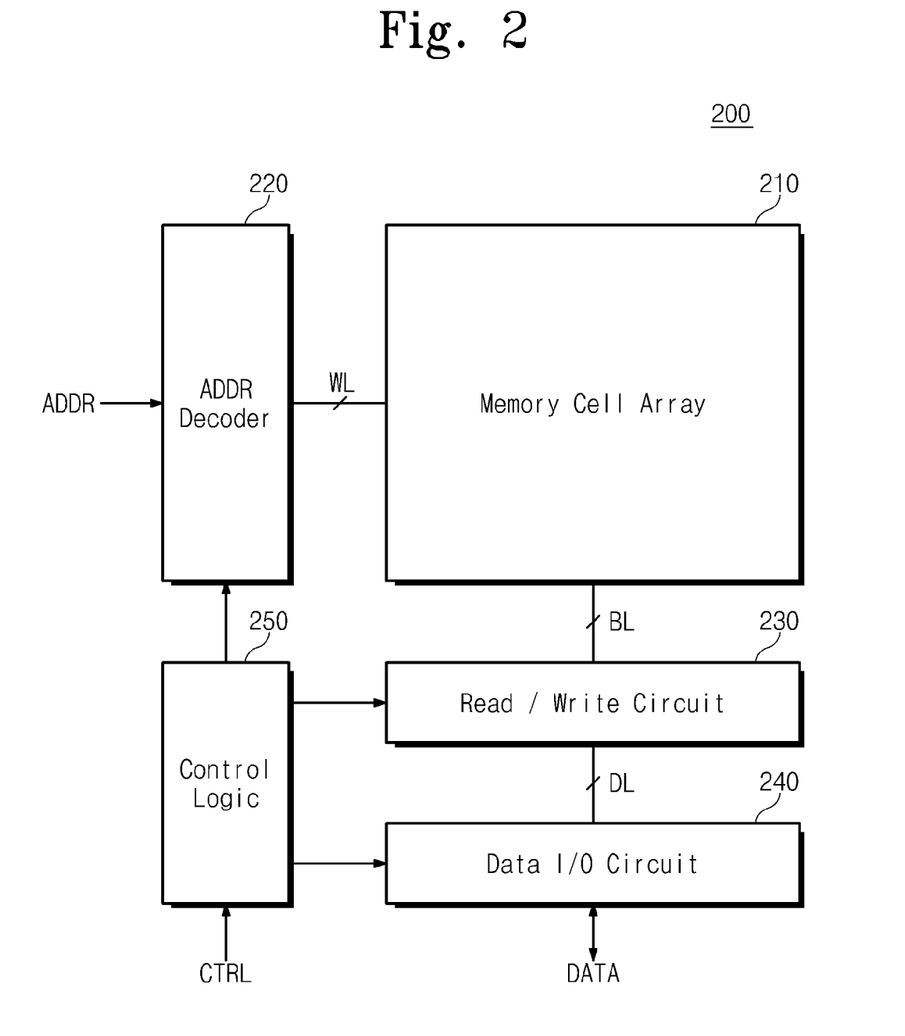
FIG. 2 is a block diagram of an embodiment of a nonvolatile memory device shown in FIG. 1.

FIG. 2 is a block diagram illustrating an embodiment of nonvolatile memory device 200. In this embodiment, nonvolatile memory device 200 comprises a memory cell array 210, an address decoder 220, a read/write circuit 230, a data input/output circuit 240, and control logic 250.

Memory cell array 210 is connected to an address decoder 220 through a wordline WL and connected to read/write circuit 230 through a bitline BL. Memory cell array 210 comprises a plurality of memory cells connected to address decoder 220 through wordline WL and connected to read/write circuit 230 through bitline BL. Read and write operations are performed on selected memory cells by applying appropriate voltages to the wordlines and bitlines connected to those memory cells.

Address decoder 220 is connected to memory cell array 210 via wordlines WL and operates in accordance with instructions from control logic 250. Address decoder 220 receives an address ADDR from an external source, such as controller 100 shown in FIG. 1. Address decoder 220 decodes address ADDR to produce a row address and a column address. It selects one or more wordlines WL based on the decoded row address and transfers the column address to read/write circuit 230. The structure of address decoder 220 may comprise, for instance, a row decoder, a column decoder, and an address buffer.

Read/write circuit 230 is connected to memory cell array 210 through bitlines BL and connected to data input/output circuit 240 through data lines DL. Read/write circuit 230 operates in accordance with instructions from control logic 250. Read/write circuit 230 selects bitlines BL in response to decoded column addresses provided from address decoder 220.

Read/write circuit 230 receives data from data input/output circuit 240 via data lines DL and stores the data in selected memory cells. Read/write circuit 230 also transmits data read out of selected memory cells to data input/output circuit 240 via data lines DL. In addition, read/write circuit 230 also performs operations in which it reads data from a first set of memory cells in memory cell array 210 and writes the data to a second set of memory cells in memory cell array 210. One example of such an operation is a copy-back operation. Read/write circuit 230 may comprise, for instance, a page buffer, a column selection circuit, a write driver, a sense amplifier, and a column selection circuit.

Data input/output circuit 240 is connected to read/write circuit 230 through data lines DL. Data input/output circuit 240 operates in accordance with instructions from control logic 250. Data input/output circuit 240 exchanges data with external devices, such as, e.g., controller 100 of FIG. 1. Data input/output circuit 240 transmits received data to read/write circuit 230 through data lines DL. Data input/output circuit 240 transmits data received from read/write circuit 230 to external devices, such as controller 100. Data input/output circuit 240 may comprise, for instance, a data buffer.

Control logic 250 controls address decoder 220, read/write circuit 230, and data input/output circuit 240. Control logic 250 operates in response to a control signal CTRL provided by an external device, such as controller 100.

Memory cell array 210 may be divided into address areas each comprising a predetermined number of memory cells, and read/write operations may be performed on the memory cells of an address area in coordination with each other. As examples, memory cell array 210 could be divided into column address areas, where memory cells within a particular column constitute a column address area, or row address areas where memory cells constitute a row address area. In fact, the address areas could take any number of different shapes, forms, or arrangements. Moreover, different address areas may overlap each other.

For explanation purposes, selected embodiments will be described in the context of a flash memory device where read/write operations are performed on address areas comprising memory cells connected to the same wordline. In alternative embodiments, other types of memory devices and other address areas could be used. Additionally, some embodiments may involve nonvolatile memory devices including multi-level memory cells for storing a plurality of bits in a single memory cell.

Where each memory cell of memory cell array 210 stores one bit, memory cells connected to one wordline may constitute one address area. Where each memory cell of memory cell array 210 stores two bits, memory cells connected to one wordline may constitute two or more address areas. As an example, memory cells connected to one wordline may provide a most significant address area formed by most significant bits (MSB) and a least significant address area formed by least significant bits (LSB).

Where each memory cell of memory cell array 210 stores "N" bits, memory cells connected to one wordline may constitute a most significant address area formed by MSBs, a least significant address area formed by LSBs, and N-2 central significant address areas formed by central significant bits (CSB) between the MSBs and the LSBs.

For explanation purposes, it will be assumed that memory cells in memory cell array 210 each store two bits. Accordingly, it is assumed that the memory cells connected to one wordline constitute two address areas. In other embodiments, however, memory cells of memory cell array 210 may store other numbers of bits and may constitute different numbers of address areas.

Figure 3:
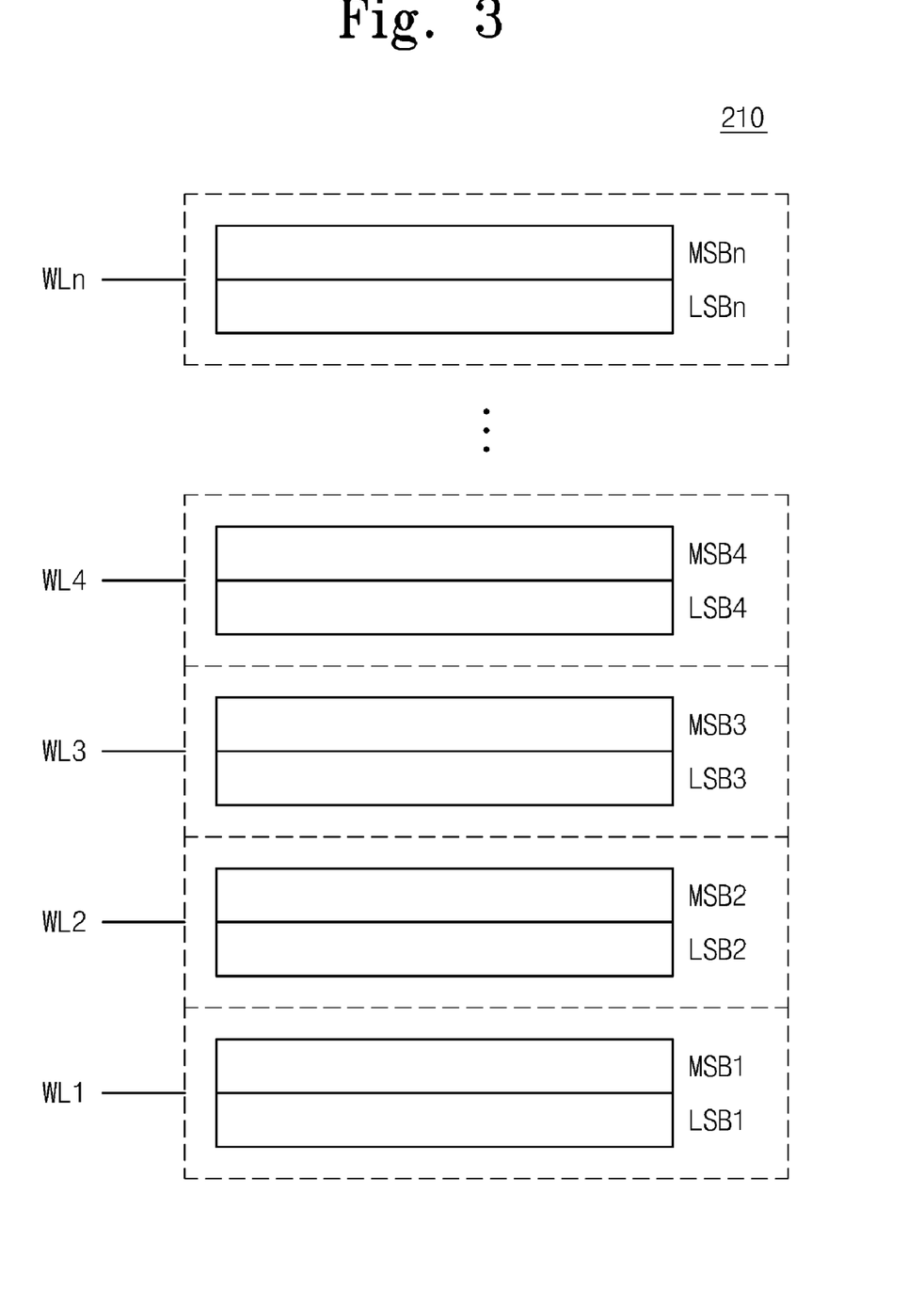
FIG. 3 is a conceptual diagram of an address area of a memory cell array shown in FIG. 2.

FIG. 3 provides a conceptual illustration of two address areas of memory cell array 210. In FIG. 3, a plurality of wordlines WL1-WLn is connected to memory cell array 210. The memory cells connected to wordlines WL1-WLn each store two bits and the memory cells connected to each word line constitute two address areas. For simplicity of explanation, FIG. 3 represents the memory cells connected to each wordline in a single block, where each block is divided into two address areas. The address areas MSB1-MSBn correspond to the MSBs of the corresponding memory cells, and the address areas LSB1-LSBn correspond to the LDBs of the corresponding memory cells. For instance, memory cells connected to wordline WL1 constitute address areas MSB1 and LSB1, where the MSBs stored in the memory cells connected to wordline WL1 correspond to most significant area MSB1, the LSBs stored in the memory cells connected to wordline WL1 correspond to least significant address area LSB1.

Figure 4:
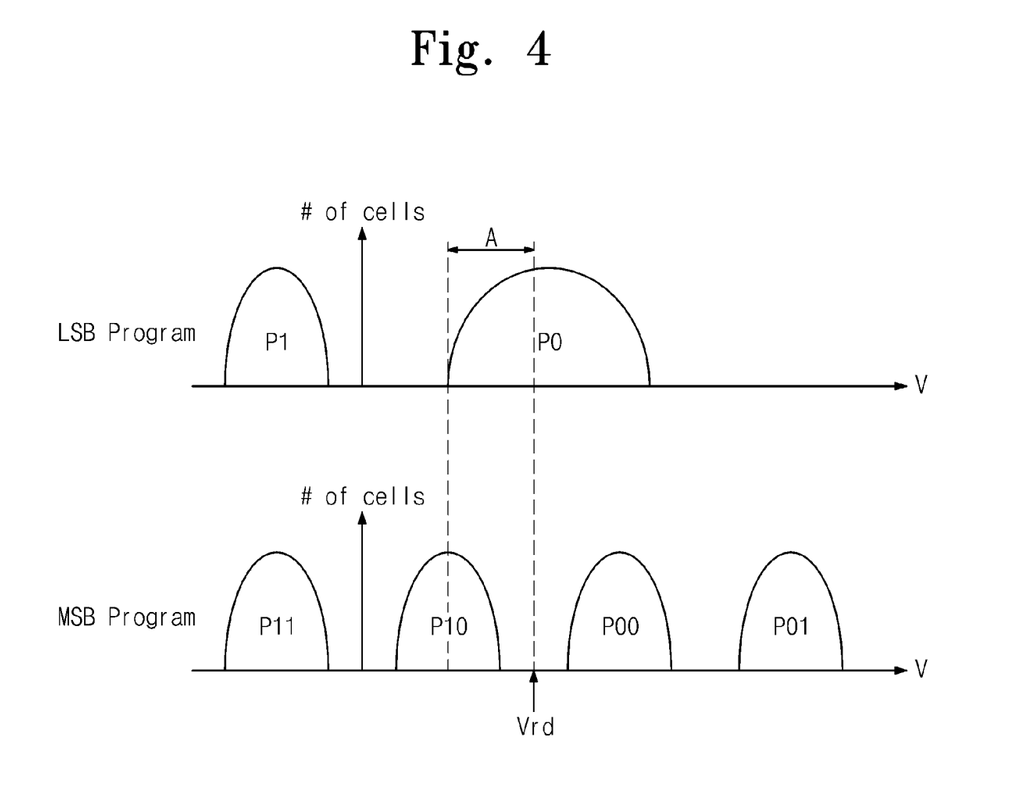
FIG. 4 is a graph illustrating a program operation of the memory cell array shown in FIGS. 1 through 3.

FIG. 4 is a graph illustrating a program operation of memory cell array 210. In FIG. 4, the horizontal axis represents a voltage (V) required to turn on memory cells, i.e., a threshold voltage of the memory cells. The vertical axis represents a number of memory cells (# of cells) having each threshold voltage. When memory cells are programmed, their threshold voltages typically increase. In memory cells storing two bits, the threshold voltages of several cells may be characterized by various distributions such as those shown in FIG. 4.

An upper diagram in FIG. 4 shows a threshold voltage distribution of memory cells subjected to LSB programming. LSB programming results in memory cells of memory cell array 210 in an erased state P1 or a programmed state P0. A lower diagram in FIG. 4 shows a threshold voltage distribution of memory cells subjected to MSB programming. MSB programming results in memory cells of memory cell array 210 being in an erased state P11 or one of programmed states P10, P00, and P01.

Memory cells that are in erased state P1 after LSB programming may be subsequently programmed to state P11 or state P10 during MSB programming. Memory cells programmed to state P0 during the LSB programming may be programmed to state P00 or P01 during MSB programming.

Memory cells in state P11 may store "11" data, memory cells in state P10 store "10" data, memory cells in state P00 store "00" data, and memory cells in state P01 store "01" data. In each of the states, the first digit represents the LSB data and the second digit represents MSB data. It should be noted that the ordering of bits and the representation of states is fairly arbitrary and could be altered. For instance, in alternative embodiments, the states be rearranged or the first digit could represent the MSB.

After MSB programming has been performed on a set of memory cells, states P11 and P10 can be distinguished from states P00 and P01 by applying a read voltage $V_{rd}$ to the word line of the memory cells. If the memory cells are in state P00 or P01, the read voltage will be insufficient to activate or turn on the cells. In other words, because the threshold voltage of cells in states P00 and P10 exceeds the read voltage, such cells are not activated by $V_{rd}$. Accordingly, where the threshold voltage of a memory cell is lower than the read voltage $V_{rd}$, it is determined that the memory cell is in state P11 or state P10. Where the threshold voltage of a memory cell is higher than read voltage $V_{rd}$, it is determined that the memory cell is in state P00 or P01.

During MSB programming, a memory cell in state P0 may be changed to state P00 or P01. That is, during an MSB program operation, the threshold voltage of the memory cell in state P0 may be increased to a threshold voltage corresponding to state P00 or P01.

Unfortunately, negative consequences may result if nonvolatile memory device 200 is powered off during MSB programming. As an example, if power is lost while memory cells are being programmed to state P00 or P01, the cells may be erroneously programmed to state P10. In FIG. 4, the letter "A" represents an example programming interval that may result in such an error. If a programming voltage is cut off during interval "A," the programmed cells may end up in state P10, resulting in an erroneous read using read voltage $V_{rd}$.

Errors that occur during MSB programming operations may also interfere with LSB data stored prior to the MSB programming. For instance, if memory device 200 is powered off during programming from state P1 to state P01, the LSB bit "1" may be erroneously changed to a "0". If the data that is changed or lost during such operations is "reliable data,"

the change or loss may interfere with the normal operation of nonvolatile memory device 200.

To prevent malfunctions of nonvolatile memory device 200 and memory system 10, including those resulting from the loss of reliable data, a program control unit such as PGM control unit 110 in FIG. 1 may control read/write operations in such a way that reliable data is protected.

Figure 5:
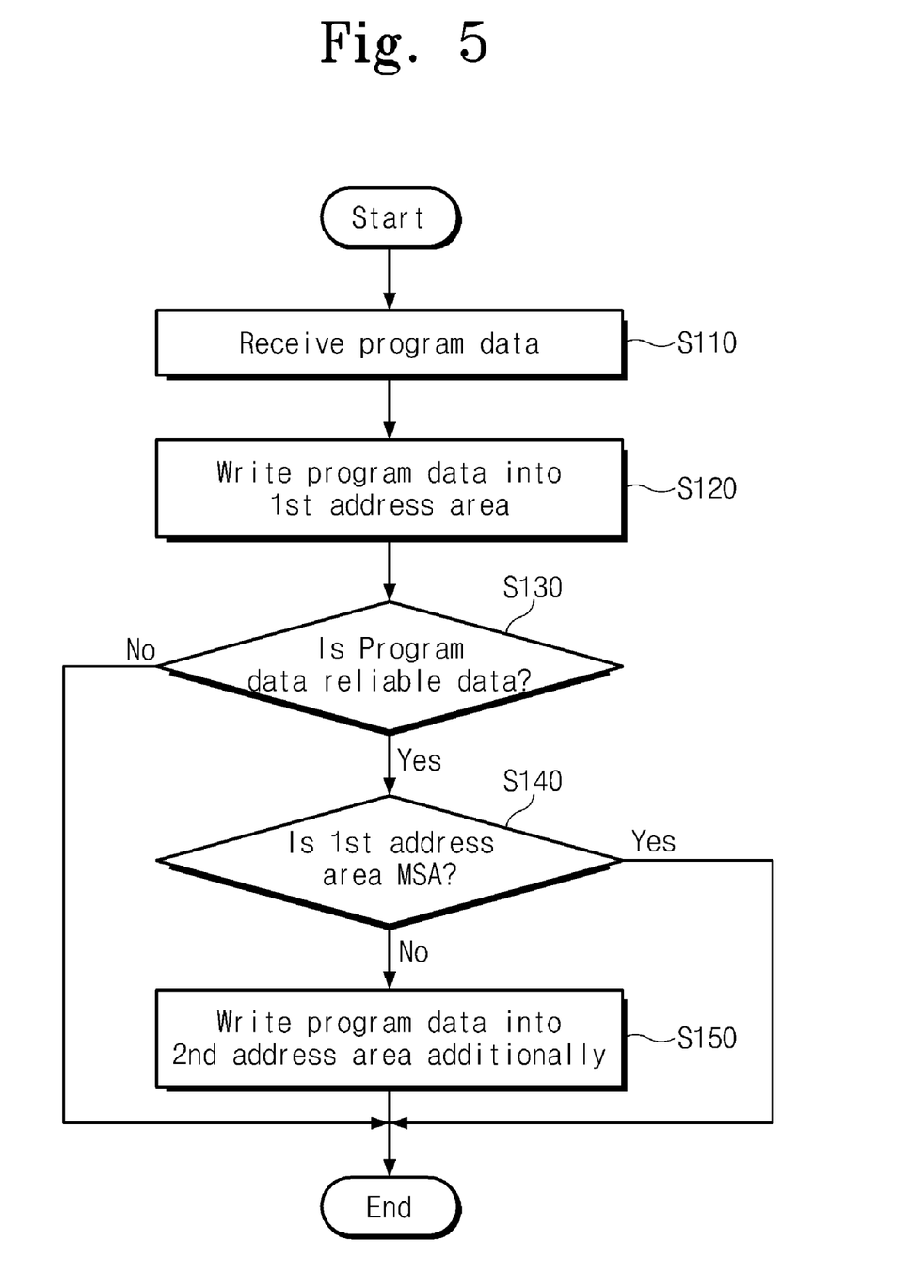
FIG. 5 is a flowchart illustrating a method of programming a nonvolatile memory device according to some embodiments of the inventive concept.

FIG. 5 is a flowchart illustrating a method of programming nonvolatile memory device 200 according to some embodiments of the inventive concept. FIGS. 6 through 9 illustrate a programming procedure based on the flowchart of FIG. 5. In the description of FIG. 5, example method steps are denoted by parentheses (SXXX) to distinguish them from system or device elements.

Referring to FIG. 5, memory system 10 receives program data (S110). The program data may be transmitted to a controller 100 from an external source such as a host system. Next, the program data is written into a first address area of nonvolatile memory device 200 (S120). For instance, PGM control unit 110 may control the program data to be stored in the first address area of nonvolatile memory device 200.

Program control unit 110 then determines whether the program data is reliable data (S130). Where the program data is not the reliable data (S130=NO), the program operation is completed while the program data is stored in the first address area. Otherwise, where the program data is reliable data (S130=YES), program control unit 110 determines whether the first address area into which the program data was written is a most significant address area (S140).

Where the first address area is a most significant address area (S140=YES), the program operation is completed while the program data is stored in the first address area. Otherwise, where the first address area is not a most significant address area (S140=NO), program control unit 110 controls the program data to be further written into a second address area of memory cell array 210 (S150). That is, if the program data is reliable data and the first address area into which the program data is written is not a most significant address area, the program data is further written into the second address area.

FIGS. 6 through 9 provide conceptual diagrams to illustrate the method of FIG. 5. Like FIG. 3, the diagrams in FIGS. 6 through 9 show least significant address areas and most significant address areas. To prevent the MSB programming of one address area from erroneously affecting (e.g., via coupling, or other noise) other address areas, two or more least address areas (e.g., LSB1 and LSB2) are programmed before the corresponding two or more most significant address areas (e.g., MSB1 and MSB2) are programmed. Similarly, other least significant address areas (e.g., LSB3 and LSB4) may be programmed before corresponding most significant address areas (e.g., MSB3 and MSB4) are programmed, and so on. Alternatively, other techniques can be employed to avoid coupling, or anti-coupling measures may be omitted.

Figure 6:
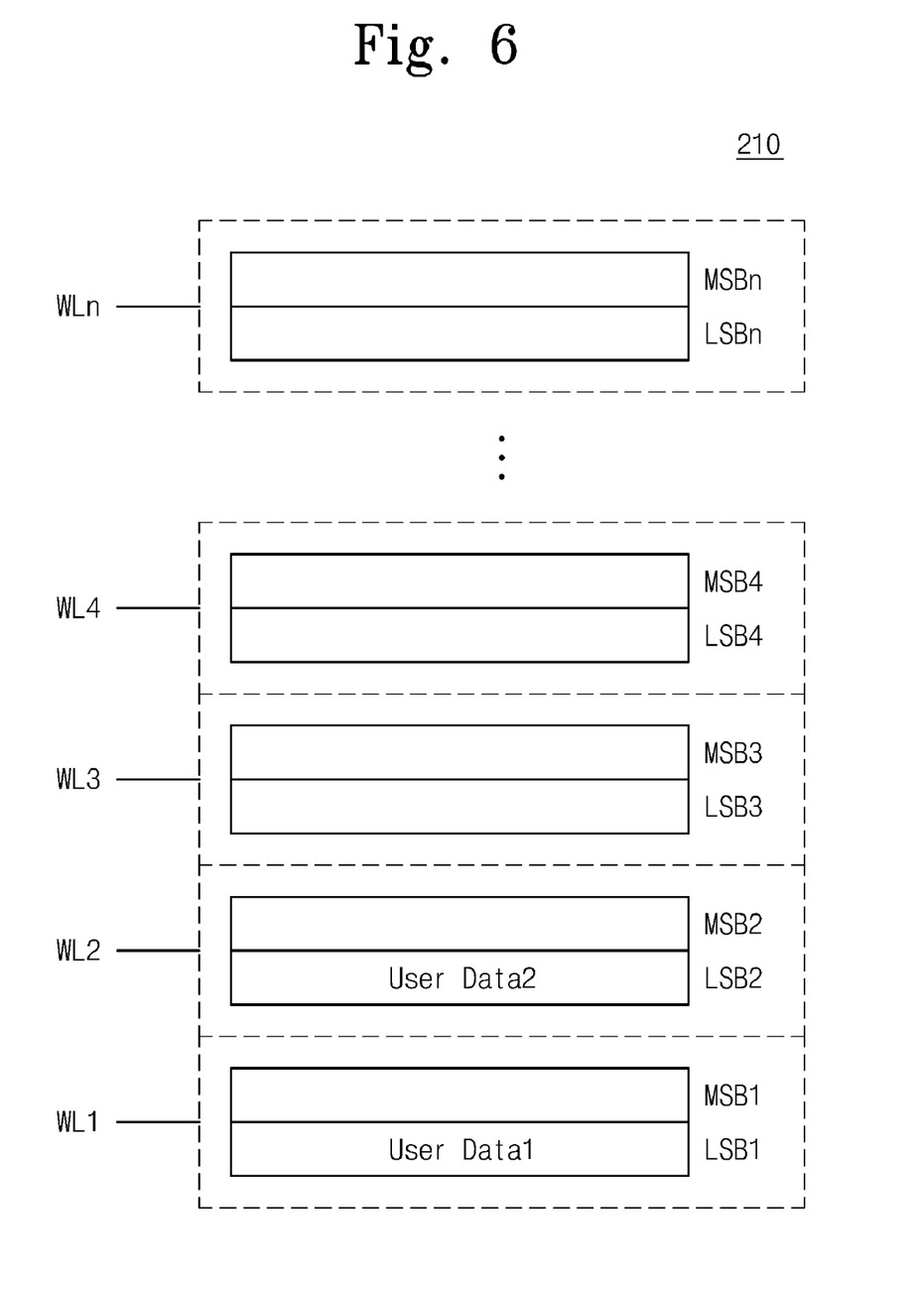
FIGS. 6 through 9 are conceptual drawings illustrating a method of programming a nonvolatile memory device in accordance with the method of FIG. 5.

Referring to FIG. 6, first and second user data, labeled User Data1 and User Data2, are stored in first and second least significant address areas LSB1 and LSB2 connected to wordlines WL1 and WL2, respectively. Because the data in areas LSB1 and LSB2 is user data, a program operation for the first user data, the programming of these areas does not require steps S140 and S150 of FIG. 5. In other words, programming of these areas terminates after S130.

Figure 7:
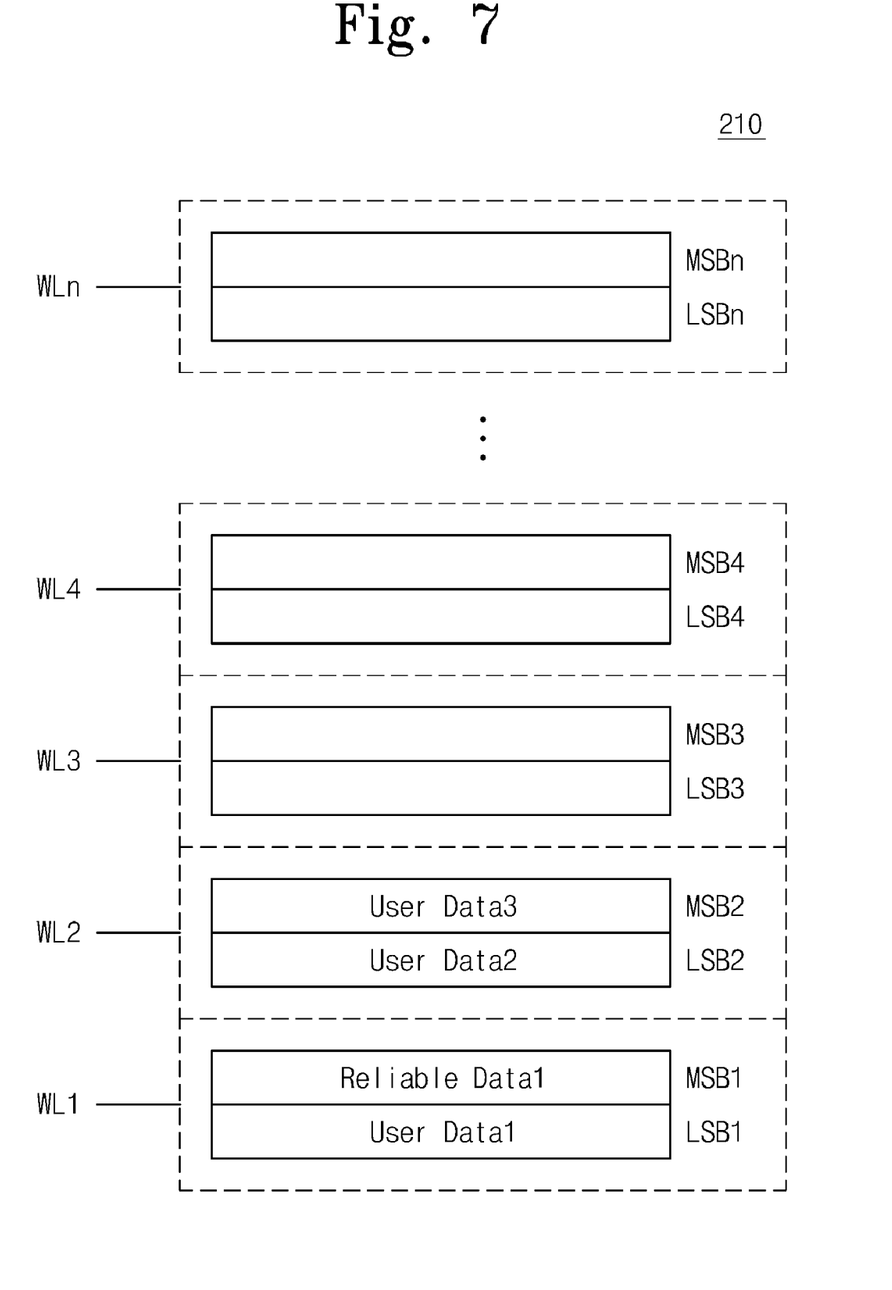

Referring to FIG. 7, first reliable data "Reliable Data1" corresponding to one address area and third user data "User Data3" corresponding to another address area are received by nonvolatile memory device 200. The first reliable data "Reliable Data1" is stored in most significant address area MSB1 connected to wordline WL1. According to the method of FIG. 5, the programming of first reliable data "Reliable Data1" to most significant address area MSB1 is complete after step S140. In other words, step S150 is not required because S140=YES when reliable data is programmed to a most significant address (MSA) area. After the first reliable data "Reliable Data1" is programmed, third user data "User Data3" is written into most significant address area MSB2 connected to a wordline WL2.

If reliable data is written to a most significant address area, loss of the reliable data may be avoided even where the nonvolatile memory device is powered off during a program operation. Accordingly, where a first address area in which program data is stored is a most significant address area, a program operation may be completed without performing step S150 even if the program data is reliable data.

Figure 8:
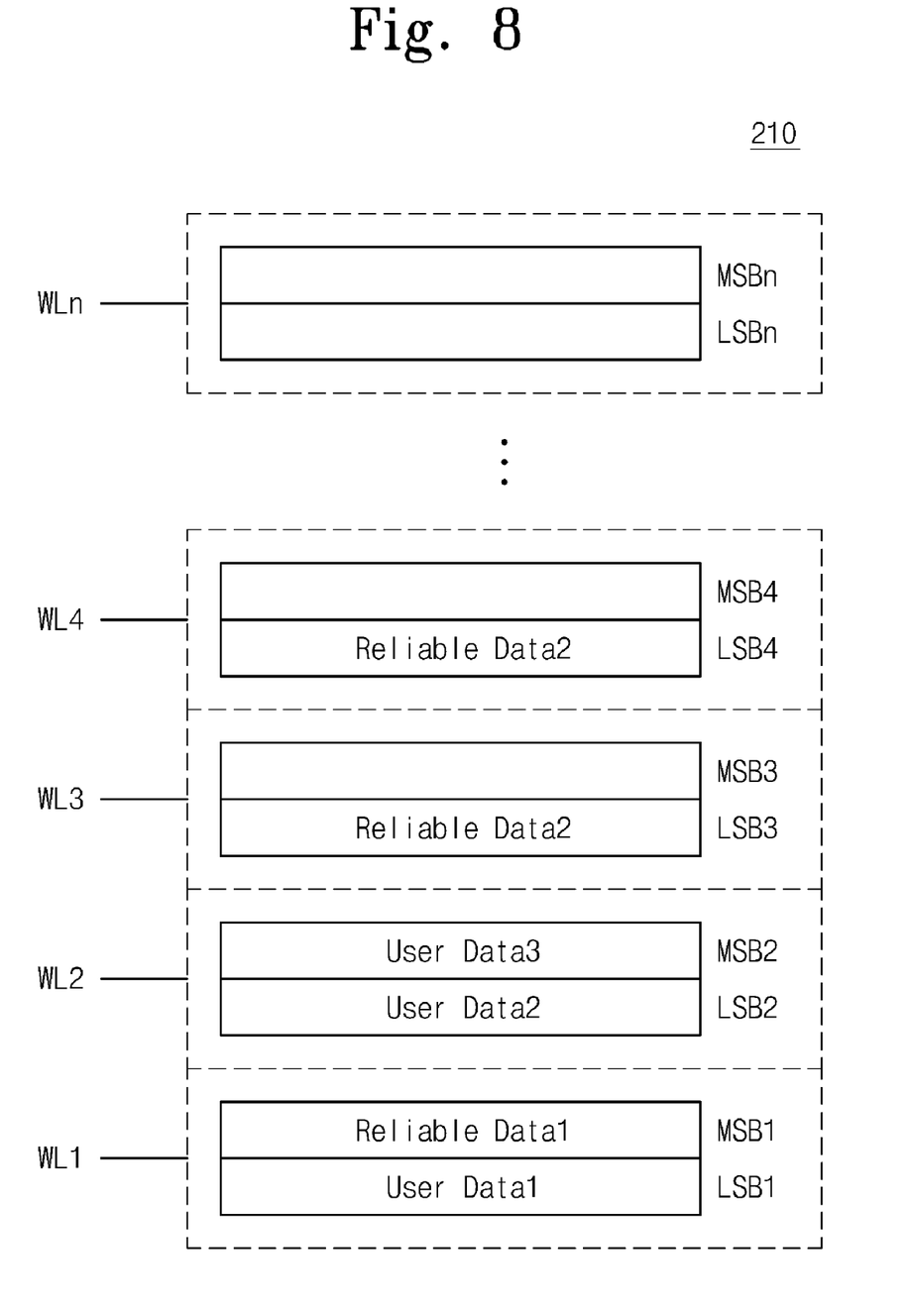

Referring to FIG. 8, second reliable data "Reliable Data2" is received by nonvolatile memory device 200. Second reliable data "Reliable Data2" is first stored in a least significant address area LSB3 connected to a wordline WL3. Then, in accordance with steps S130 through S150 of FIG. 5, second reliable data "Reliable Data2" is also stored in least significant address area LSB4 because it is reliable data and address area LSB3 in which it was first stored is not a most significant address area.

The operation for writing second reliable data "Reliable Data2" to address area LSB4 may be implemented as a copyback operation where read/write circuit 230 first reads the second reliable data from area LSB3 and then writes the second reliable data to area LSB4. As an alternative, the second reliable data "Reliable Data2" may be re-transmitted to nonvolatile memory device 200 from controller 100, together with an address of second address area LSB4 where it is to be stored. As another alternative, second reliable data "Reliable Data2" may be re-transmitted to nonvolatile memory device 200 from controller 100. Nonvolatile memory device 200 may count up or down an address (e.g., row address) of first address area LSB3 in accordance with instructions from controller 100. The program data may be written into an address generated by the count-up or count-down. In still other alternatives, nonvolatile memory device 200 may receive an address of a second address area from controller 100, or perform a count-up or count-down address from the address of area LSB3, and then re-transmit the second reliable data "Reliable Data2" from a buffer in data input/output circuit 240 or read/write circuit 230 to the address received from nonvolatile memory device 200 or the buffer.

The reliable data stored in first address area LSB3 may be lost during programming of the most significant address area MSB3 connected to wordline WL3. However, if the reliable data stored in first address area LSB3 is lost, it can be recovered from second address area LSB4. Thus, malfunctions can be avoided by maintaining a redundant copy of the reliable data. In addition, in some embodiments, if reliable data stored in first address area LSB3 is lost, the reliable data stored in the second address area LSB4 may be copied to a third address area so that reliable data will continue to be stored in two locations.

Figure 9:
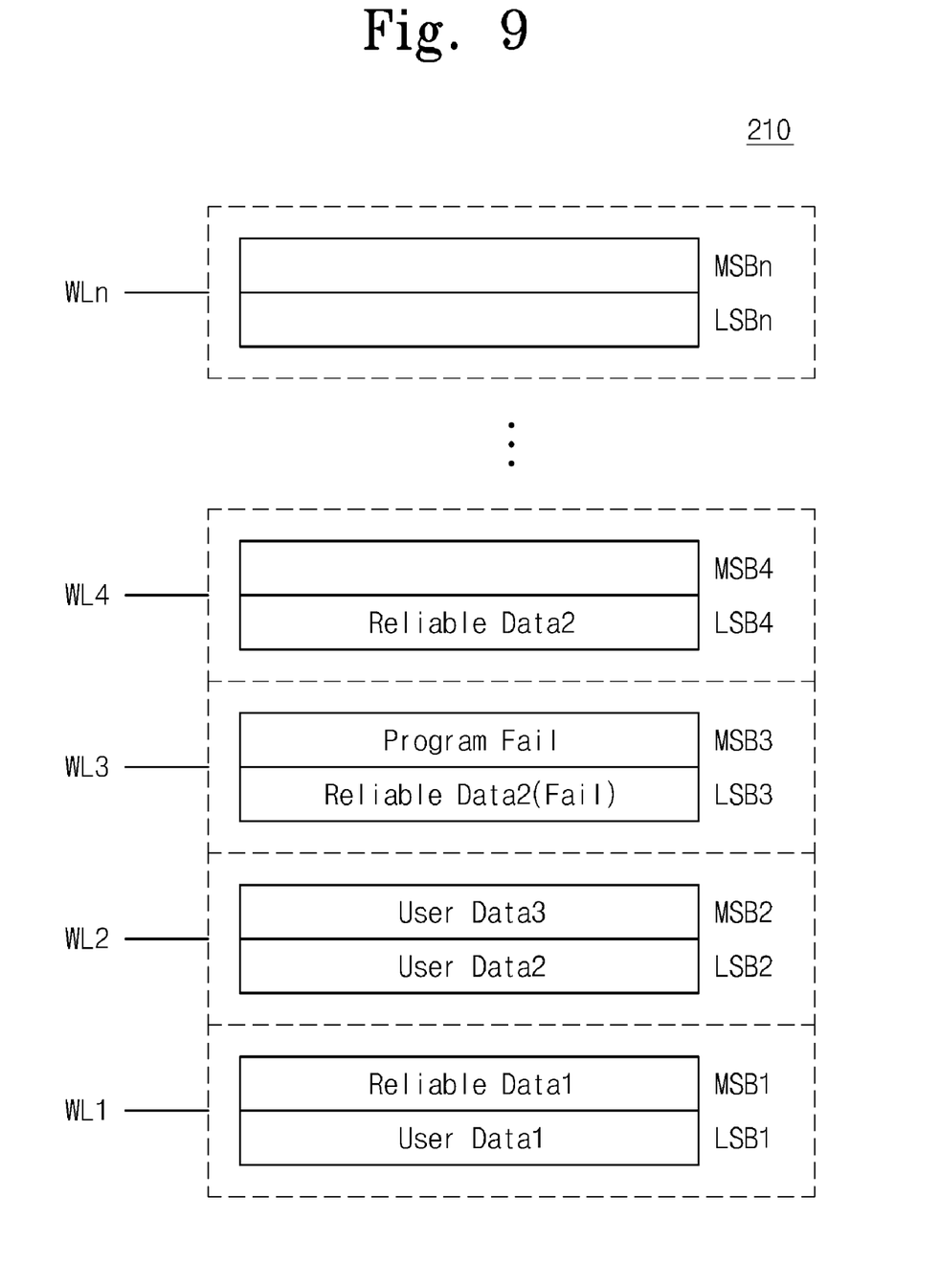

FIG. 9 illustrates a scenario where nonvolatile memory device 200 is powered off during a program operation of most significant address area MSB3. The powering off of nonvolatile memory device 200 causes errors in the data stored in least significant area LSB3. As a result, access to least significant address area LSB3 in which the lost reliable data is stored may be mapped to access to the least significant address area LSB4 in which normal reliable data is stored.

As illustrated by the above embodiments, nonvolatile memory device 200 and memory system 10 are configured to store data in a first address area and, if the data is reliable data, to additionally store it in a second address area. Thus, certain errors can be avoided when power is disconnected from nonvolatile memory device 200 during MSB programming operations.

In certain embodiments, the control operation of FIG. 5 may be performed by PGM control unit 110 in controller 100, which may be implemented in hardware such as a digital or analog circuit or a hybrid of digital and analog circuitry. PGM control unit 110 could also be implemented, in part or entirely, by software within controller 100. For example, the control operation of the controller 110 could be implemented as a part of a flash translation layer (FTL). Control unit 110 could also be implemented in controller 100 as a hybrid of hardware and software.

The foregoing embodiments describe nonvolatile memory device 200 in the form of a flash memory device. In other embodiments, nonvolatile memory device 200 could be implemented in other forms of memory, such as, ROM, PROM, EPROM, EEPROM, PRAM, MRAM, RRAM, and FRAM. In addition, nonvolatile memory device 200 could be implemented as a multi-level memory storing more than two bits in each memory cell. In general, nonvolatile memory device 200 could include N-bit memory cells, where "N" is any positive integer.

In embodiments where nonvolatile memory device 200 includes N-bit memory cells, where "N" is greater than two, redundant copies of reliable data may be stored whenever the reliable data is first stored in an address that is not a most significant address area. For instance, if the reliable data is first stored in a least significant address area or a central significant address area, a copy of the reliable data may be stored in another additional address area.

In some embodiments, where read/write operations of nonvolatile memory device 200 are performed by a unit of "M" memory cells, an address area may be formed by the unit of "M" memory cells. Accordingly, MSBs stored in the "M" memory cells may constitute a most significant address area, while LSBs stored in the "M" memory cells may constitute a least significant address area. Where CSBs between the MSBs and the LSBs are stored in the "M" memory cells, they may constitute central significant address areas. Where program data programmed in the "M" memory cells is reliable data and an address area in which the program data is stored is not a most significant address area, the program data may be additionally stored in another address area.

Figure 10:
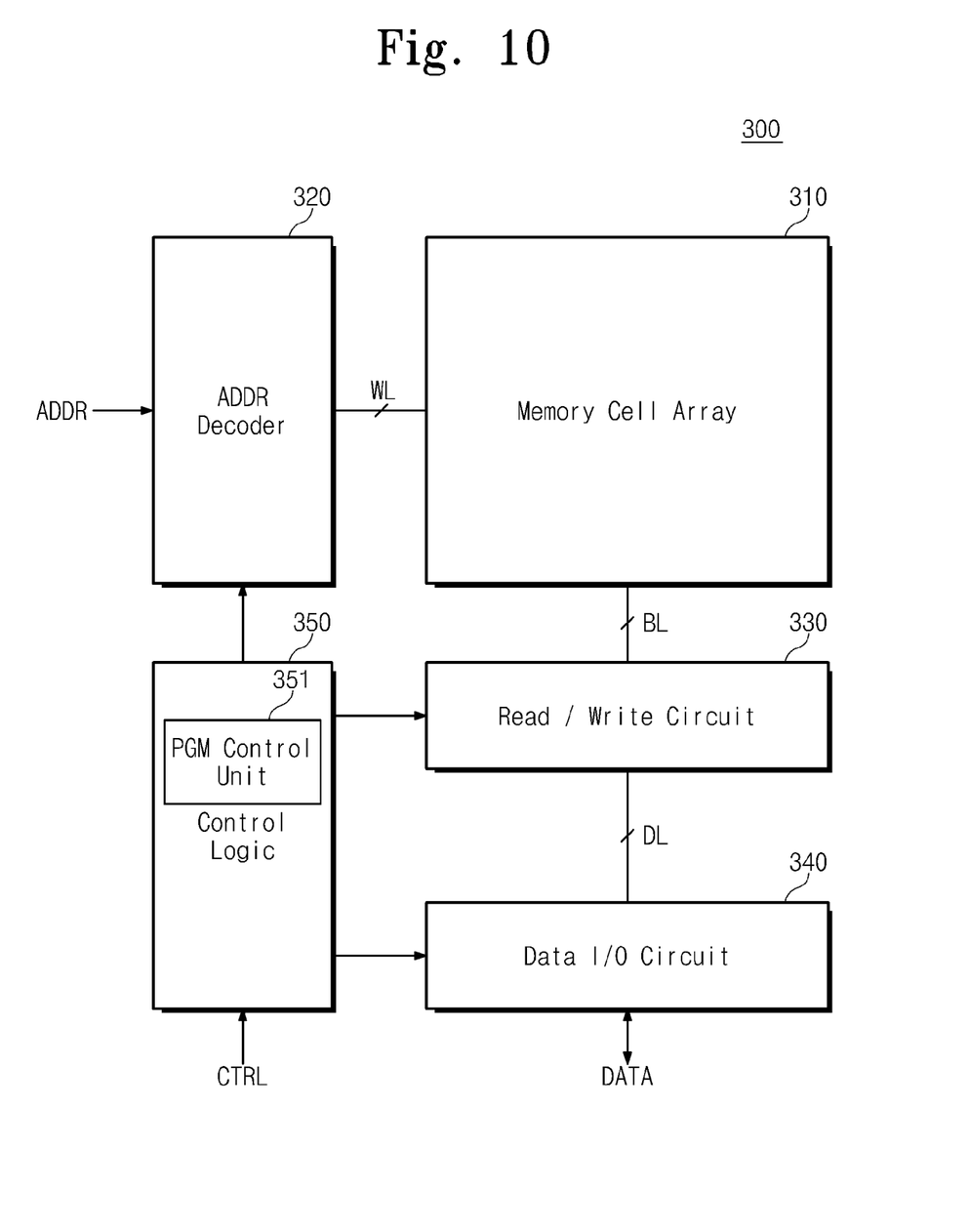
FIG. 10 is a block diagram of a nonvolatile memory device according to other embodiments of the inventive concept.

FIG. 10 is a block diagram of a nonvolatile memory device 300 according to other embodiments of the inventive concept. Nonvolatile memory device 300 comprises a memory cell array 310, an address decoder 320, a read/write circuit 330, a data input/output circuit 340, and a control logic 350.

Memory cell array 310, address decoder 320, read/write circuit 330, data input/output circuit 340, and control logic 350 may be organized with the same structure and operate the same as memory cell array 210, address decoder 220, read/write circuit 230, data input/output circuit 240, and control logic 250 as are described with reference to FIG. 2. Accordingly, a detailed description of these elements will be omitted to avoid redundancy.

Control logic 350 controls all operations of nonvolatile memory device 300 and comprises a program control unit 351. Additionally, program control unit 351 may operate the same as program control unit 110 described with reference to FIGS. 1 through 9. That is, program control unit 351 may be configured to store program data in a first address area and to further store the program data in a second address area if the program data is not user data but reliable data. Since the operation of program control unit 110 has been described in detail with reference to FIGS. 1 through 9, a more detailed description of the operation of program control unit 351 will be omitted to avoid redundancy.

Figure 11:
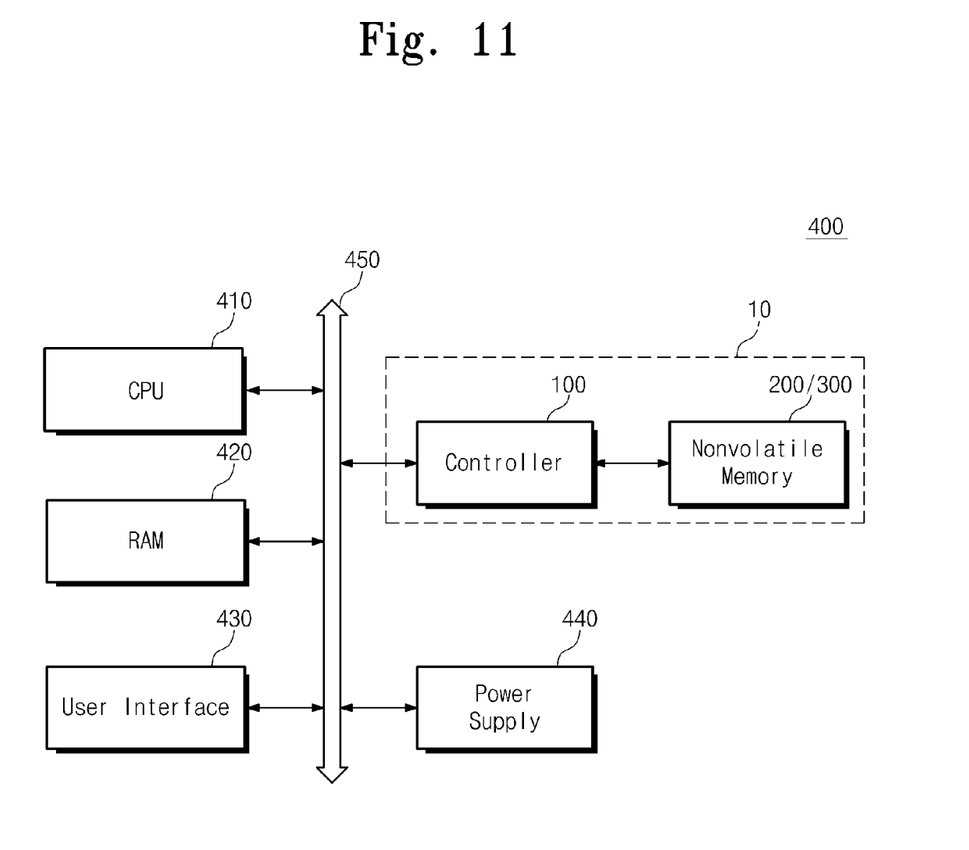
FIG. 11 is a block diagram of a computing system with a memory system comprising a nonvolatile memory device according to some embodiments of the inventive concept.

FIG. 11 is a block diagram of a computing system 400 comprising a memory system 10 with nonvolatile memory device 200 or 300 according to still other embodiments of the inventive concept. Computing system 400 comprises a central processing unit (CPU) 410, a random access memory (RAM) 420, a user interface 430, a power supply 440, and memory system 10.

Memory system 10 is electrically connected to CPU 410, RAM 420, user interface 430, and power supply 440 through a system bus 450. Data provided through user interface 430 or processed by CPU 410 is stored in memory system 10. Memory system 10 comprises a controller 100 and nonvolatile memory device 200/300.

In some embodiments, as set forth in FIGS. 1 through 9, memory system 10 comprises controller 100 and nonvolatile memory device 200. Controller 100 comprises a program control unit. In other embodiments, as set forth in FIG. 10, memory system 10 comprises a controller 100 and a nonvolatile memory device 300 with a control logic 350 comprising a program control unit 351.

Where memory system 10 is installed as a solid state disk/drive (SSD), a booting speed of the computing system 300 may be dramatically improved. Although not shown in the figure, a system according to the inventive concept may further comprise an application chipset and a camera image processor.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of programming a nonvolatile memory device, comprising:
    storing program data in a first address area;
    determining whether the first address area is a most significant address area and whether the program data is reliable data; and
    upon determining that the first address area is not a most significant address area and that the program data is reliable data, additionally storing the program data in a second address area.

2. The method of claim 1, further comprising:
    upon determining that the first address area is a most significant address area, completing the programming without additionally storing the program data in the second address area.

3. The method of claim 1, wherein the first address area is a central significant address area.

4. The method of claim 1, wherein the nonvolatile memory device is a flash memory device.

5. The method of claim 4, wherein the flash memory device comprises N-bit memory cells.

6. The method as set forth in claim 1, wherein:
additionally storing the program data in a second address area comprises reading data stored in the first address area and storing the read data in the second address area.

7. The method as set forth in claim 1, wherein:
additionally storing the program data in a second address area comprises incrementing or decrementing an address of the first address to generate an address for the second address area.

8. The method as set forth in claim 1, wherein:
the reliable data comprises metadata.

9. The method of claim 1, wherein the first and second address areas correspond to different columns of memory cells within a memory cell array.

10. A nonvolatile memory device comprising:
a memory cell array;
a read/write circuit configured to write and read data to and from the memory cell array; and
a control logic configured to control the read/write circuit, wherein the control logic:
controls the read/write circuit to store program data in a first address area;
determines whether the first address area is a most significant address area and whether the program data is reliable data; and
upon determining that the first address area is not a most significant address area and that the program data is reliable data, controls the read/write circuit to additionally store the program data in a second address area.

11. The nonvolatile memory device of claim 10, wherein when the control logic determines that the first address area is a most significant address area, the control logic controls the read/write circuit to complete a program operation without additionally storing the program data in the second address area.

12. The nonvolatile memory device of claim 10, wherein the first address area is a central significant address area.

13. The nonvolatile memory device of claim 10, wherein the memory cell array comprises a plurality of multi-bit flash memory cells.

14. A system comprising:
a nonvolatile memory device; and
a controller configured to control the nonvolatile memory device,
wherein the controller controls the nonvolatile memory device to write program data into a first address area or into the first address area and a second address area according to a reliability information of the program data and an address of the first address area; and
wherein the controller further controls the nonvolatile memory device to write program data into the first and second address areas when the reliability information indicates that the program data is reliable data and the address of the first address area indicates a most significant bit.

15. The system of claim 14, further comprising:
a central processing unit configured to communicate with the controller to initiate operations for programming the nonvolatile memory device.

16. The system of claim 14, wherein the nonvolatile memory device and the controller constitute a solid state drive.

17. The system of claim 14, wherein the nonvolatile memory device and the controller constitute a memory card.

* * * * *